United States Patent [19]

Wrathall

[11] Patent Number: 4,725,912
[45] Date of Patent: Feb. 16, 1988

[54] POWER MOS LOSS OF GROUND PROTECTION

[75] Inventor: Robert S. Wrathall, Tempe, Ariz.

[73] Assignee: Motorola Inc., Schaumburg, Ill.

[21] Appl. No.: 80,258

[22] Filed: Jul. 27, 1987

Related U.S. Application Data

[63] Continuation of Ser. No. 874,909, Jun. 16, 1986, abandoned.

[51] Int. Cl.⁴ .............................................. H02H 9/00
[52] U.S. Cl. ......................................... 361/18; 361/49
[58] Field of Search ...................... 361/18, 42, 49, 50, 361/58; 363/50

[56] References Cited

U.S. PATENT DOCUMENTS 3,996,497 12/1976 Kamimura ...................... 361/18 X Primary Examiner—A. D. Pellinen
Assistant Examiner—Todd E. DeBoer
Attorney, Agent, or Firm—Dale E. Jepsen

[57] ABSTRACT

A power MOS switching device is provided wherein certain protective circuits in a control portion thereof remain functional when a ground connection to said control portion is lost.

6 Claims, 2 Drawing Figures

POWER MOS LOSS OF GROUND PROTECTION

This application is a continuation, of application Ser. No. 874,909, filed 6-16-86 now abandoned.

BACKGROUND OF THE INVENTION present invention relates, in general, to the field of power MOS switches. More particularly, the present invention relates to a power MOS switch having a control circuit which includes current limit, power dissipation limit and thermal limit circuits wherein these protection circuits retain their capability after loss of ground connection to the control circuit.

There have been previously described power MOS switching circuits wherein a CMOS control circuit is used to control a high power MOS device. The CMOS control circuit includes current limit, power dissipation limit and thermal limit portions which prevent the destruction of the power MOS device. Such a circuit is commercially available from Motorola, Inc. and bears Part No. XPC1500. While this control circuit provides certain protection to the power MOS device under normal conditions these protective circuits cease to function or their function is degraded when the ground connection to the control circuit is lost. When this control circuit loses its ground connection, the IC portion of the device will float to approximately the supply voltage causing the power MOS to turn on partially. Since none of the device protection functions are then operational, the power MOS device can then go to thermal destruction.

SUMMARY OF THE INVENTION

It is therefore an object of the present invention to provide a power MOS switching device having an improved control circuit.

It is further an object of the present invention to provide a power MOS switching device wherein the current limit, power dissipation limit and thermal limit portions of the control circuit continue to function after loss of the ground connection to the control circuit.

The foregoing and other objects are achieved in the present invention wherein there is provided an improved power MOS switching device. The switching device comprises a power transistor having a control terminal and first and second load current terminals and a CMOS control circuit having input, drive and first and second voltage supply terminals. The first voltage supply terminal of the CMOS control circuit is coupled to the first load current terminal of the power transistor for coupling to a first voltage reference. The drive terminal of the CMOS control circuit is coupled to the control terminal of the power transistor and the second voltage supply terminal of the CMOS control circuit is coupled to a second voltage reference. The switching device further comprises a diode having anode and cathode terminals, the anode terminal being coupled to the second voltage supply terminal of the CMOS control circuit and the cathode terminal being coupled to the second load current terminal of the power transistor for coupling to a third voltage reference. In operation, when the second voltage reference is lost from the second voltage supply terminal of the CMOS control circuit sufficient current is supplied through the diode to enable the protective circuits of the CMOS control circuit to continue functioning and provide the desired protections for the power transistor.

BRIEF DESCRIPTION OF THE DRAWINGS

The above mentioned and other features and objects of the present invention will become more apparent and the invention itself will be best understood by reference to the following description of an embodiment of the invention taken in conjunction with the accompanying drawings wherein.

DESCRIPTION OF A PREFERRED EMBODIMENT

Figure 1:
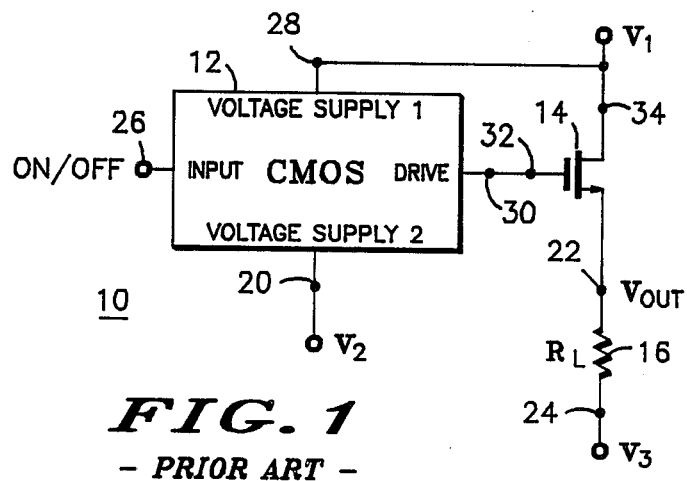
FIG. 1 is a schematic diagram of a prior art power MOS switching circuit.

With reference to FIG. 1 a prior art power MOS switching circuit is shown. CMOS control circuit 12 is used to control power transistor 14 in response to an input applied to input terminal 26 of CMOS control circuit 12. In practice load resistor 16 may be located at some remote location from CMOS control circuit 12 and power transistor 14. The voltage references provided at terminals 20 and 24 would therefore be supplied at different physical locations. Depending on the particular physical connections there may be occasions where the voltage rererence supplied at terminal 20 is lost while the voltage reference supplied at terminal 24 remains intact. Under these conditions CMOS control circuit 12 may float to approximately the supply voltage at terminal 28, thereby allowing power transistor 14 to turn on. In this state the current limit, power dissipation limit, and thermal limit protections normally provided by CMOS control circuit 12 will be inoperative or degraded and power transistor 14 could be subject to destruction as a result.

Figure 2:
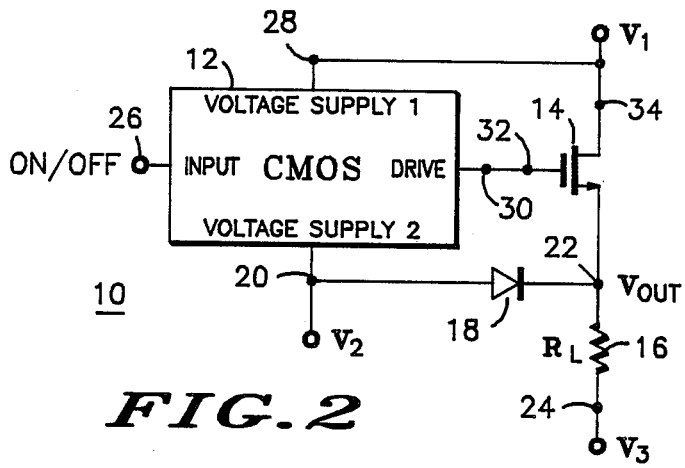
FIG. 2 is schematic diagram of a power MOS switching circuit in accordance with the present invention.

Referring now to FIG. 2, there is shown a power MOS switching circuit in accordance with the present invention. First voltage supply terminal 28 of a CMOS control circuit having input 26, drive 30, and first 28 and second 20 voltage supply terminals, is coupled to drain terminal 34 of power transistor 14 having drain 34, source 22 and gate 32 terminals. Drain terminal 34 of power transistor 14 is also coupled to a first source of supply voltage. Drive terminal 30 of CMOS control circuit 12 is coupled to gate terminal 32 of power transistor 14. The second voltage supply terminal 20 of CMOS control circuit 12 is coupled to a second source of supply voltage. Second voltag terminal 20 of CMOS control circuit 12 is also coupled to the anode terminal of diode 18, the cathode terminal of which is coupled to source terminal 22 of power transistor 14 for coupling to the first terminal of load 16 having first and second terminals, the second terminal of which is coupled to a third source of supply voltage.

In normal operation the inventive circuit would operate in the same fashion as that of the prior art circuit. A control signal applied to input terminal 26 of CMOS control circuit 12 would essentially be applied to gate terminal 32 of power transistor 14, turning on power transistor 14 and coupling supply voltage $V_1$ to load 16 at terminal 22. The advantage of the inventive circuit becomes apparent when under certain failure conditions supply voltage $V_2$, normally applied to second voltage supply terminal 20 of CMOS control circuit 12, is for some reason lost. Under these conditions diode 18 would allow a certain amount of current to flow from second supply voltage terminal 20 of CMOS control circuit 12 via terminal 22 through load 16 to supply voltage $V_3$ at terminal 24. The current supplied through diode 18 is sufficient to allow the protective circuits of CMOS control circuit 12, that is the current limit, power dissipation limit, and thermal limit protective circuits of CMOS control circuit 12, to remain in operation and therefore provide these protections to power transistor 14.

While the inventive circuit has been described in connection with a particular CMOS control circuit and power transistor it is to be clearly understood that this description is made only by way of example and not as a limitation to the scope of the invention as described in the appended claims.

I claim:

1. A power switching device comprising a power transistor having a control terminal and first and second load current terminals;
   a control circuit having input, drive and first and second voltage supply terminals, said first load current terminal coupled to said first voltage supply terminal for connection to a first voltage reference, said drive terminal coupled to said control terminal, said second voltage supply terminal coupled to a second voltage reference, and said second load current terminal for coupling to a third voltage reference; and
   a diode having anode and cathode terminals, said anode terminal coupled at said second voltage supply terminal and said cathode terminal coupled at said second load current terminal for providing a current path from said second voltage supply terminal to said second load current terminal when said connection from said second voltage supply terminal to said second voltage reference is lost.

2. The circuit of claim 1 wherein said power transistor is a MOS transistor.

3. The circuit of claim 1 wherein said control circuit is a CMOS control circuit.

4. The circuit of claim 1 wherein said power switching device is a single integrated circuit.

5. The circuit of claim 1 where said second voltage reference and said third voltage reference are substantially the same value.

6. The circuit of claim 5 wherein said second voltage reference and said third voltage reference are physically separated.

* * * * *